(12) United States Patent
Dondini et al.

(10) Patent No.: US 11,543,842 B2
(45) Date of Patent: Jan. 3, 2023

(54) PROCESSING SYSTEM, CORRESPONDING APPARATUS AND CORRESPONDING METHOD

(71) Applicant: STMICROELECTRONICS S.r.l., Agrate Brianza (IT)

(72) Inventors: Mirko Dondini, Catania (IT); Daniele Mangano, San Gregorio di Catania (IT); Riccardo Condorelli, Tremestieri Etneo/Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 345 days.

(21) Appl. No.: 16/803,942

(22) Filed: Feb. 27, 2020

(65) Prior Publication Data

US 2020/0278711 A1    Sep. 3, 2020

(30) Foreign Application Priority Data

Feb. 28, 2019    (IT) .................. 102019000002961

(51) Int. Cl.
| | | |
|---|---|---|
| *G05F 1/00* | (2006.01) | |
| *G05F 1/575* | (2006.01) | |
| *G05B 19/042* | (2006.01) | |
| *G06F 13/40* | (2006.01) | |
| *H03B 5/32* | (2006.01) | |
| *H03K 19/17736* | (2020.01) | |

(52) U.S. Cl.
CPC ......... *G05F 1/575* (2013.01); *G05B 19/0423* (2013.01); *G06F 13/4068* (2013.01); *H03B 5/32* (2013.01); *H03K 19/17744* (2013.01)

(58) Field of Classification Search
CPC ....... G05F 1/575; G06F 13/4068; H03B 5/32; H03K 19/17744
USPC .......................................................... 323/273
See application file for complete search history.

(56) References Cited

U.S. PATENT DOCUMENTS

| | | | | |
|---|---|---|---|---|
| 8,004,887 | B2 * | 8/2011 | Roohparvar | G11C 7/1057 |
| | | | | 365/198 |
| 8,222,918 | B1 * | 7/2012 | Tan | H03K 19/018585 |
| | | | | 326/86 |
| 9,197,157 | B1 | 11/2015 | Lin | |
| 10,355,693 | B1 * | 7/2019 | Jain | H03K 19/00346 |
| 2015/0378385 | A1 | 12/2015 | Rana et al. | |
| 2019/0006990 | A1 * | 1/2019 | Marques | H03B 5/364 |
| 2019/0302817 | A1 * | 10/2019 | Rosolowski | H02M 3/07 |

FOREIGN PATENT DOCUMENTS

EP    3 407 201 A1    11/2018

* cited by examiner

*Primary Examiner* — Chun Kuan Lee
(74) *Attorney, Agent, or Firm* — Seed Intellectual Property Law Group LLP

(57) ABSTRACT

An integrated circuit includes a clock control circuit coupled to a reference clock signal node and a plurality of circuits including a voltage regulator, a digital circuit, and an analog circuit. The voltage regulator, in operation, supplies a regulated voltage. The clock control circuit, in operation, generates a system clock. Input/output interface circuitry is coupled to the plurality of circuits and a common input/output node. The input/output interface circuitry, in operation, selectively couples one of the plurality of circuits to the common input/output node.

20 Claims, 4 Drawing Sheets

PROCESSING SYSTEM, CORRESPONDING APPARATUS AND CORRESPONDING METHOD

BACKGROUND

Technical Field

The description relates to integrated circuits having embedded processing systems.

Description of the Related Art

In processing circuits for general purpose application, such as microcontrollers or System-On-Chip (SoC), like the STM32 microcontroller, crystal oscillators, either placed internally on the microcontroller chip or externally, is used for stable and accurate frequency generation. This requires that the microcontroller has the capability to provide a regulated power supply in particular to the external crystal oscillator when needed.

However, microcontrollers have in general also requirements such as low power operation and reduced package pin count, which for instance dictate to use a general purpose Input/Output node and not a dedicated one, in order to save package pin count and to drive such general purpose Input/Output node according to application needs.

Known disclosures for providing an internal voltage regulator in such microcontrollers provide that a package pin of the micro-controller is dedicated to the power connection between internal regulated power supply and the external crystal oscillator. However this requires the addition of a dedicated node, since this cannot be obtained at the expense of the flexibility of the GPIO exploitation, which allows covering different application in general purpose market.

Thus it may happen that a dedicated pin is not available for those applications of microcontrollers where an external crystal oscillator is never required and for those applications where a regulated power supply fed to the external crystal oscillator is never needed and for those applications where the external crystal oscillator receiving regulated power from the micro-controller is used during specific time windows.

BRIEF SUMMARY

Despite the extensive activity in that area, improved disclosures are desirable to provide a reasonable level of security without giving rise to overly complex (and correspondingly expensive) arrangements.

One or more embodiments provide a circuit having the features set forth in the claims that follow.

One or more embodiments may relate to a corresponding apparatus (e.g., a consumer product such as a microcontroller-based consumer product such as a home appliance) and a corresponding method.

The claims form an integral part of the technical teaching provided herein in respect of the embodiments.

One or more embodiments provides that a regulated voltage output is made available without pin count change, this determining a board BoM (Bill of Materials) reduction without package impact).

One or more embodiments provides also GPIO flexibility, since applications with or without external oscillator, applications with external oscillator with or without regulated voltage from the processing circuit can be handled, not needing a different package or specific package options.

In some embodiments, a processing system comprises an oscillator management circuit supplying an oscillator signal to a clock controller in said microcontroller generating a system clock, such oscillator management circuit comprising at least a node for the coupling of an external crystal oscillator, an internal voltage regulator coupled to a digital voltage supply node supplying as output a regulated power, a General Purpose Input/Output circuit (GPIO) comprising an analog circuit shared by a plurality of analog circuits of the microcontroller via respective analog links under the control of a General Purpose Input/Output controller, a digital input output circuit shared by a plurality of digital circuits of the microcontroller also operating under the control of the General Purpose Input/Output controller, said analog circuit and digital circuit being coupled to a common input/output node.

In some embodiments, an integrated circuit comprises: a clock control circuit, which, in operation, generates a system clock, the clock control circuit being coupled to a reference clock signal node; a plurality of circuits including: a voltage regulator, which, in operation, supplies a regulated voltage; a digital circuit; and an analog circuit; and input/output interface circuitry coupled to the plurality of circuits and a common input/output node, wherein the input/output interface circuitry, in operation, selectively couples one of the plurality of circuits to the common input/output node.

In some embodiments, a system comprises: a processor system and a crystal oscillator coupled to a clock control circuit of the processor system. The processor system includes: the clock control circuit, which, in operation, generates a system clock, the clock control circuit being coupled to a reference clock signal node; a plurality of circuits including: a voltage regulator, which, in operation, supplies a regulated voltage; a digital circuit; and an analog circuit; and input/output interface circuitry coupled to the plurality of circuits and a common input/output node, wherein the input/output interface circuitry, in operation, selectively couples one of the plurality of circuits to the common input/output node.

In some embodiment, a method comprises: generating, by a clock control circuit of an integrated circuit, a system clock; and selectively coupling one of a plurality of circuits to a common input/output node, the plurality of circuits including: a voltage regulator, which, in operation, supplies a regulated voltage; a digital circuit; and an analog circuit; wherein when the common input/output node is coupled to an input node of an crystal oscillator, the voltage regulator is coupled to the common input/output node.

One or more embodiments may be applied to microcontrollers or System-on-Chip (SoC) arrangements for general purpose applications.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
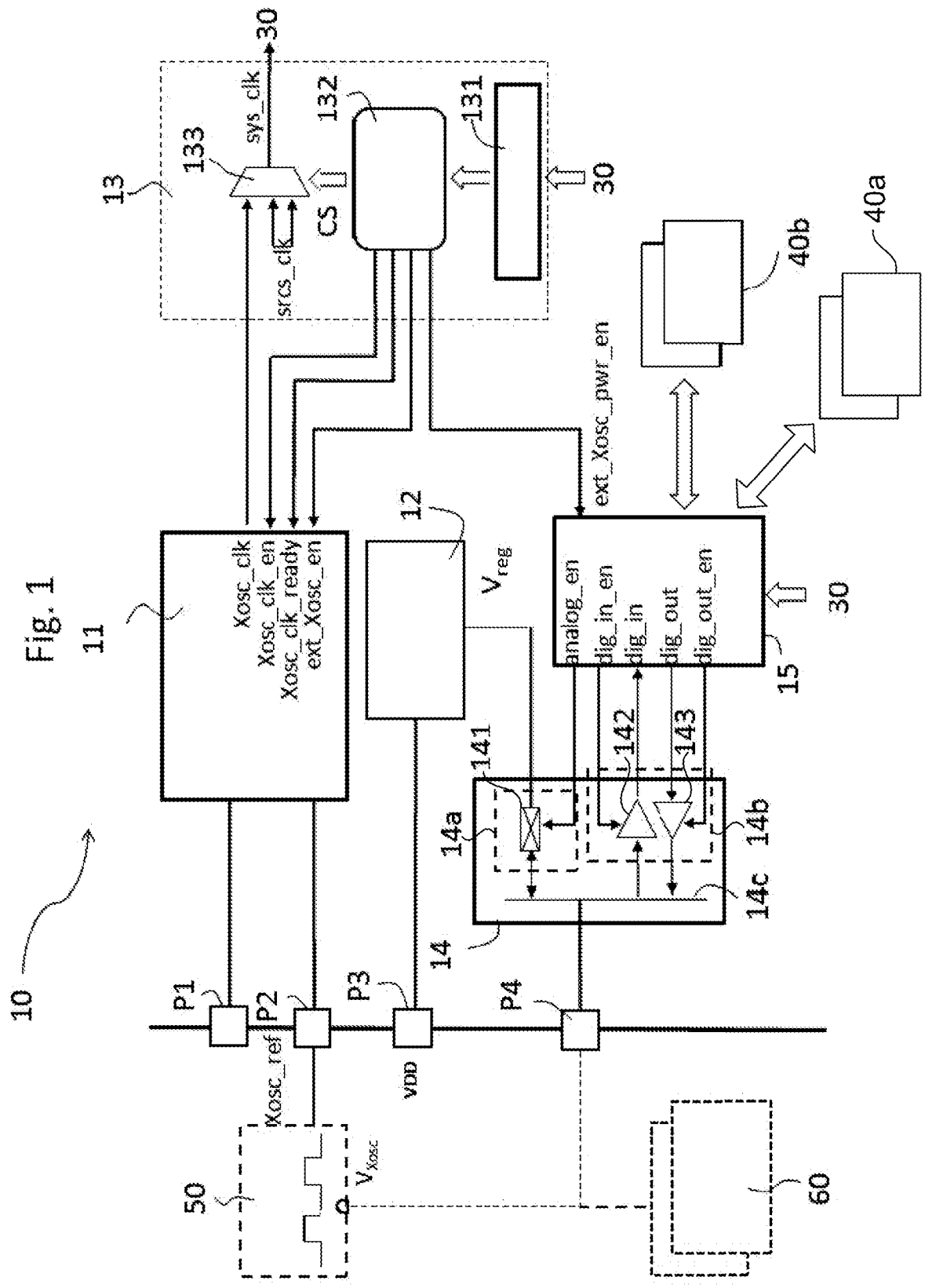
FIG. 1 is a block diagram of an example system according to embodiments.

The block diagram of FIG. 1 is an example of a processing system 10, in particular a general purpose microcontroller, which is shown partially. In particular the core comprising a central processing circuit is not shown and indicated by signals exchanged with a reference 30 representing such central processing circuit. With the reference 11 is indicated an oscillator control circuit 11. Such an oscillator management circuit 11 is a circuit to which an external crystal oscillator 50 can be coupled to obtain a frequency reference Xosc_ref and provides an external oscillator clock signal Xosc_clk to a clock controller 13.

As mentioned a central processing circuit 30 of the processing system 10, illustratively shown with a reference number 30 in FIG. 1, commands a control logic 132 of the clock controller 13 through program registers 131. The control logic 132 of the clock controller 13 is configured to issue a selection signal CS to a multiplexer 133 receiving a plurality of clock signals, among which is an external oscillator clock signal Xosc_clk and other clock signals from other sources clk_srcs, to select a system clock sys_clk for use in the processing system 10. Such control logic 132 also is configured, under the control of the central processing circuit 30 to issue clock control signal, which include handshake signals, including an enable external clock signal Xosc_clk, and a ready external clock signal Xosc_clk ready to communicate with the oscillator control circuit 11, and also an external oscillator enable signal Xosc_en to control enabling and disabling of the external oscillator 50 by the oscillator control circuit 11.

According to an aspect of the present disclosure, the control logic 132 also is configured under the control of the CPU 30 to issue an external oscillator power enable signal ext_Xosc_pwr_en, which enables the power of the chip of the processing system 10 to be supplied to an external oscillator 50 if present. As better detailed in the following the external oscillator power enable signal ext_Xosc_pwr_en performs a gating of a control bit of a switch enabling the powering of the external oscillator 50.

To this regard, in FIG. 1 the external crystal oscillator 50 is shown in dashed lined, to indicate that such external crystal oscillator 50 may be present coupled to the processing system 10 (as shown in the following in the configuration of FIG. 4) or not. In particular the processing system 10 include two nodes P1 and P2 (e.g., pins, pads, terminals, etc.) for the output of frequency reference Xosc_ref and for the input of commands of the control circuit 11, to which the oscillator control circuit 11 is thus coupled. Nodes P1 and P2 are used in general to couple an external quartz if the crystal oscillator is implemented internally by the micro-controller. In the case of the disclosure, with an external crystal oscillator, no quartz is connected and one between nodes P1 or P2 is used to provide in input to the micro-controller the clock Xosc_ref generated by external oscillator 50

The processing system 10 then includes an internal voltage regulator 12 which is coupled to a third node P3, on which the digital voltage supply VDD can be coupled and configured to output a regulated electric power $V_{reg}$ to the circuits of the processing circuit 10.

A General Purpose Input/Output circuit (GPIO) 14 is then provided within the processing system 10, which comprises an analog circuit 14a. In general the analog circuit 14a may be shared by a plurality of analog circuits 40a of the processing system 11 via respective analog links under the control of a General Purpose Input/Output controller 15, which enables selective coupling of the desired link to a common rail 14c, and then to a common input/output node P4 by controlling respective switches on the links.

The General Purpose Input/Output circuit 14 may thus include a hardware capability to connect plural analog circuits 40a to a same GPIO, thus permitting access to a same external destination from different internal sources. To that effect, access to a shared path within a GPIO may be gained through dedicated analog switches 141, embedded in the GPIO, for example, one for each analog circuit connected thereto. These switches 141 may be controlled by means of digital enable signals, analog_en, from digital logics, e.g., control 15, associated with the analog circuits 40a thereby allowing or denying transmission of analog signals pertaining to a certain circuit to an output node, e.g., node P4, handled by the General Purpose Input/Output circuit 14.

Electrical contention avoidance among these multiple possible connections may be achieved by means of software running on an embedded core, e.g., the CPU 30. This may configure a product according to a certain selected application, enabling appropriate couplings between one or more analog circuits 40a and a certain GPIO circuit, e.g., common rail 14c and common node P4.

The General Purpose Input/Output circuit 14 includes also a digital input output circuit 14b as well shared by a plurality of digital circuits 40b of the processing circuit 10, also operating for access to the General Purpose Input/Output circuit 14 under the control of the General Purpose Input/Output controller 15. The digital circuit 143 includes digital input circuitry 143 and digital output circuitry 142, in particular input and output buffers for the digital signals. Such analog circuit 14a and digital circuit 14b are both coupled through the common rail 14c to the common input/output node P4.

In FIG. 1, it is shown that the General Purpose Input/Output controller 15 supplies an analog enable signal analog_en to the analog circuit 14a as control signal of an analog switch 141 which is coupled to the output of the voltage regulator 12 supplying the regulated voltage $V_{reg}$. Downstream of the analog switch 141 the corresponding analog link is coupled to the rail 14c/node P4. The General Purpose Input/Output controller 15 also is configured to exchange digital input signal dig_in and digital output signal dig_out between the digital input circuitry 143 and digital output circuitry 142 respectively and the digital circuits 40b, providing also digital control signals, e.g., digital input enable dig_in_en and digital output enable signals dig_out_en to the digital input circuitry 143 and digital output circuitry 142 respectively to enable/disable, e.g., putting in an ON/OFF state of operation, such circuitry.

The General Purpose Input/Output controller 15 is configured to operate the above function and to issue the above signals under the control of the CPU 30.

In FIG. 1 it is also shown a block representing one or more external target circuits 60, which can be coupled to the processing system 10. They are shown in dashed lined indicating that they can be either present and coupled to the processing system 10 or not, according to the application.

Figure 3:
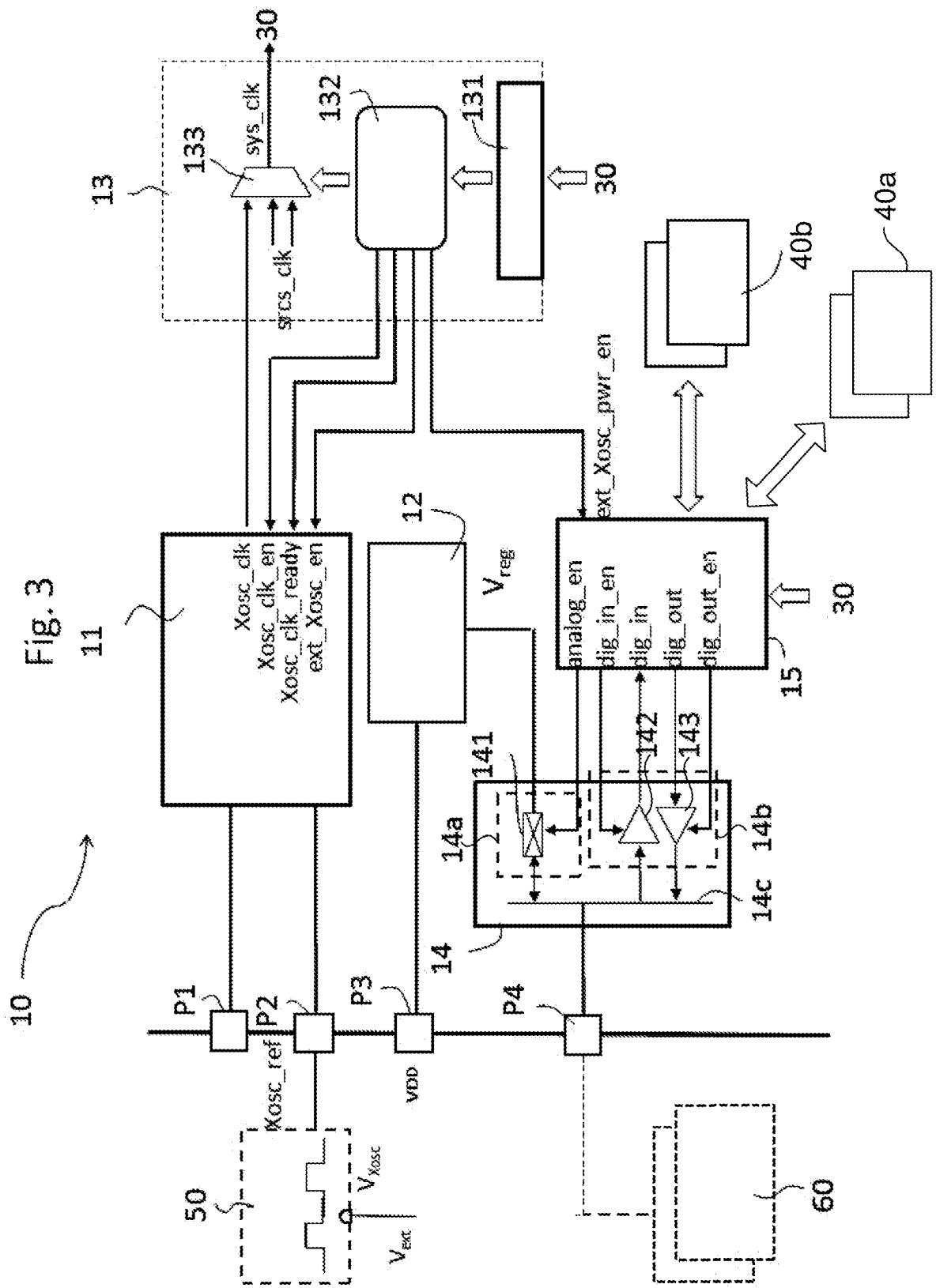
FIG. 3 is a block diagram of the system of FIG. 1 in an example configuration.

In FIG. 3 it is shown the configuration of the processing system 10 when the external crystal oscillator 50 is present, but it is powered off-chip, e.g., the power supply is not delivered by the power regulator 12 of the processing circuit 10. As shown in FIG. 3 a power supply input $V_{Xosc}$ of the external crystal oscillator 50 is coupled to an external voltage supply $V_{ext}$.

In that case, the General Purpose Input/Output controller 15 supplies an analog enable signal analog_en with a value, e.g., logic high value, which switches off, e.g., opens the analog switch 141. The digital input enable dig_in_en and digital output enable signals dig_out_en are supplied by the GPIO controller 15 as to have the digital input circuitry 143 on and digital output circuitry 142 off when digital input is needed by the digital circuits 40b, and vice versa when the digital output is needed, so to avoid contention on the shared node P4. Digital data can thus be exchanged with the external target circuits 60.

Figure 4:
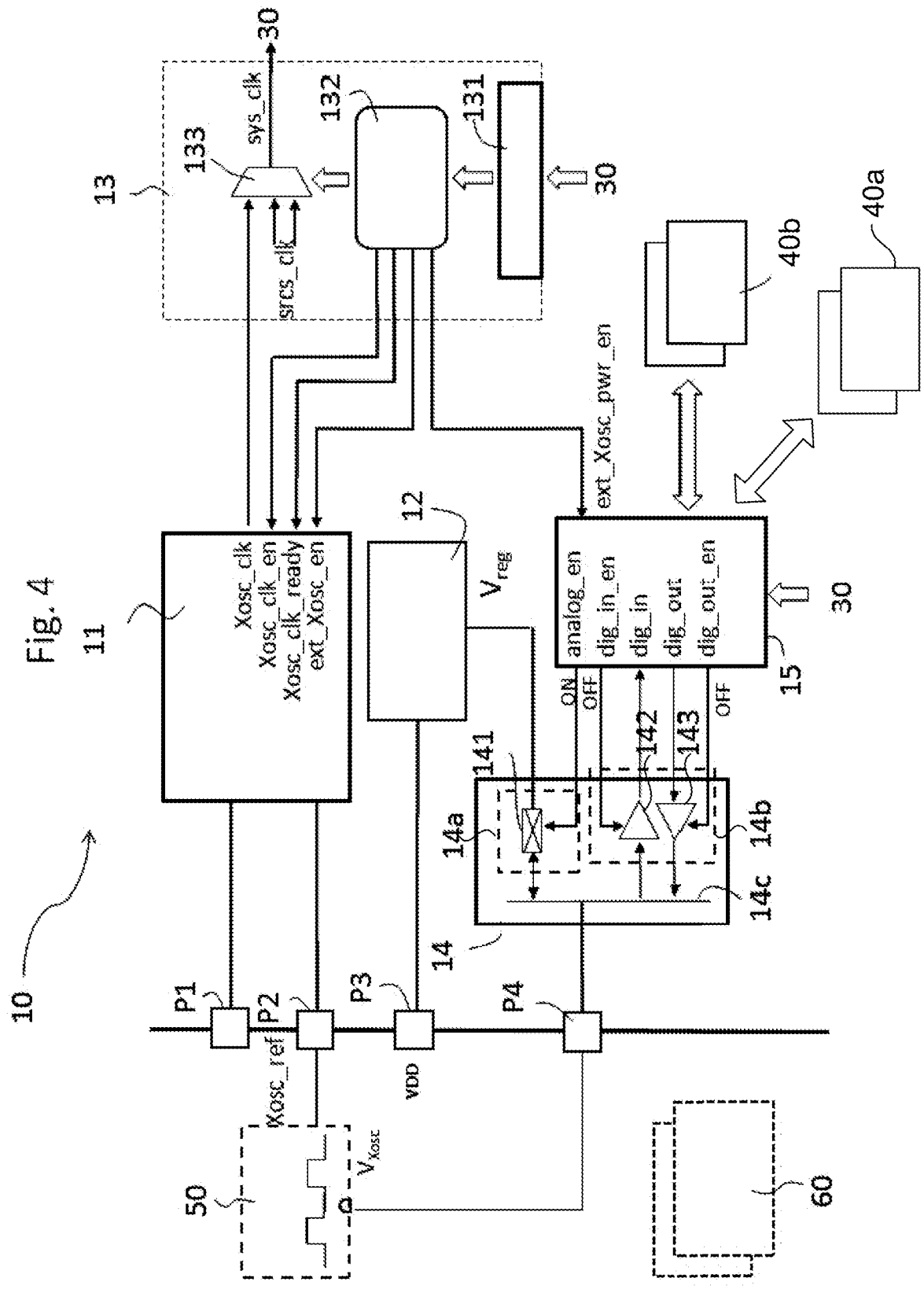
FIG. 4 is a block diagram of the system of FIG. 1 in an example configuration.

Then in FIG. 4 it is shown the configuration of the processing system 10 when the external crystal oscillator 50 is present and it is powered on-chip, e.g., the power supply is delivered to the oscillator 50, e.g., to the power input $V_{Xosc}$, by the power regulator 12 of the processing system 10.

In that case, the General Purpose Input/Output controller 15 supplies an analog enable signal analog_en which can switch on or off, e.g., close or open, the analog switch 141. In this way, when the enable signal analog_en is ON, the regulated power $V_{reg}$ of the power regulator 12 can be allowed to reach the shared node P4, to which the external oscillator 50 is coupled. The digital input enable dig_in_en and digital output enable dig_out_en signals are supplied by the General Purpose Input/Output controller 15 with values which determines the digital input circuitry 143 and digital output circuitry 142 to be off, so to avoid contention on the shared node P4. In this condition digital data cannot be exchanged with the external target circuit 60.

In this configuration, the software enable signal analog_en, e.g., the switch control signal, is gated by the external oscillator power enable signal ext_Xosc_pwr_en issued by the control logic 132 according to node configuration or mode:
  in analog mode, in which a power connection is available on the shared node P4, e.g., for the external oscillator 50, the external oscillator power enable signal ext_Xosc_pwr_en is ON, e.g., enables the enable signal analog_en to be propagated to the switch 141;
  in digital mode, in which the connection of digital circuits 40b is possible on the shared node P4, the external oscillator power enable signal ext_Xosc_pwr_en is OFF, therefore the enable signal analog_en is not propagated and the shared node P4 can be accessed by the digital circuit 14b of the GPIO circuit 14, which digital input enable dig_in_en and digital output enable dig_out_en signals are then driven by the General Purpose Input/Output controller 15 according to the requirements of the relevant applications.

It is here observed that the disclosure described herein allows driving power or digital input/output through the same shared node P4, in a controlled manner. On the same shared node P4, configured in analog mode, different analog signals can be connected to external analog circuits, sharing the same link with external oscillator regulated power, again under supervision of the digital controls of the GPIO Controller block through, e.g., signals analog_en1, analog_en2 as similarly shown in the following with reference to FIG. 2.

Thus it is provided a gated power enable signal, e.g., analog_en gated by ext_Xosc_pwr_en, to control the analog switch 141 dedicated to the power coupling.

Figure 2:
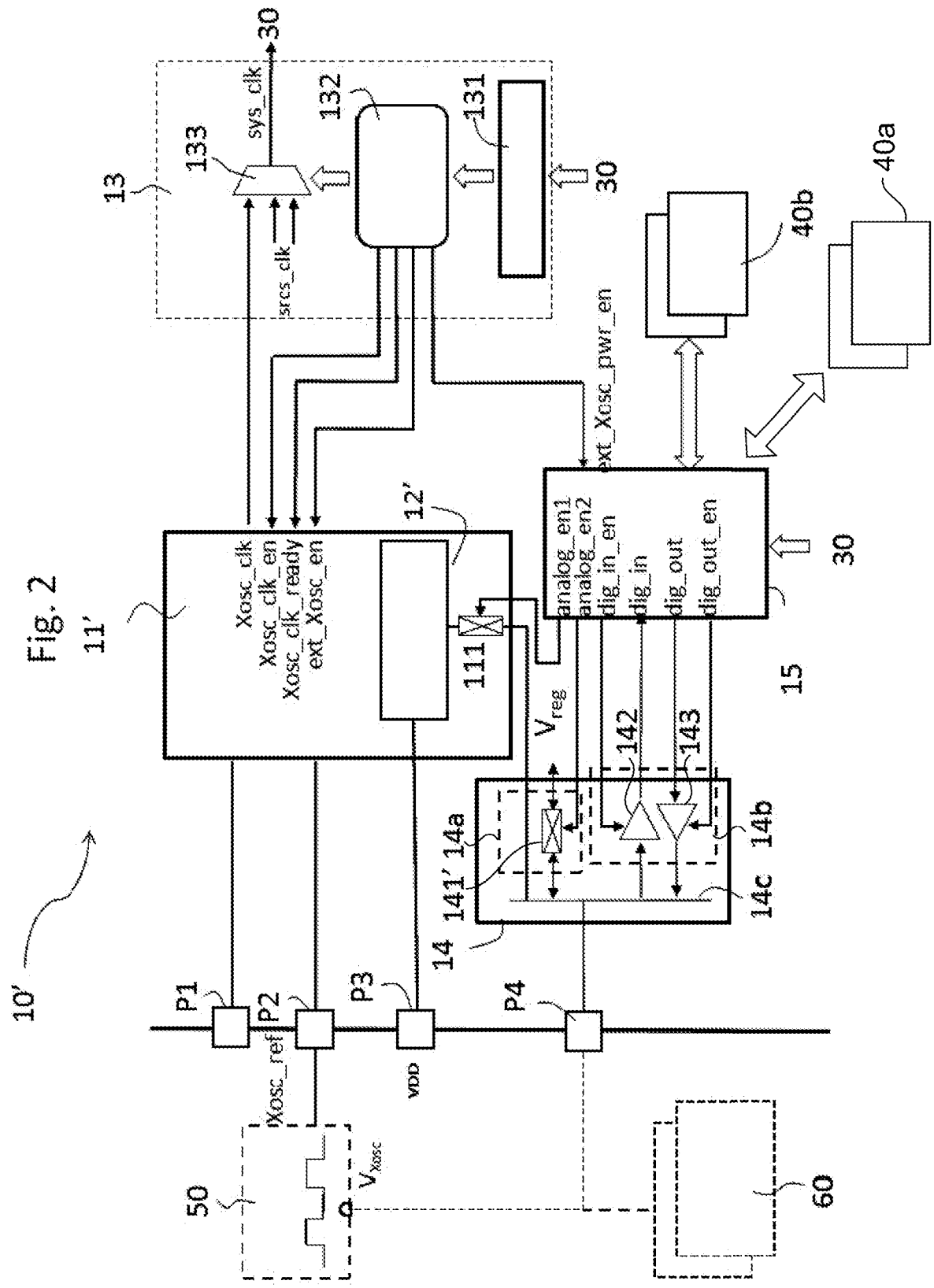
FIG. 2 is a block diagram of an example system according to variant embodiments.

In FIG. 2 it is shown an embodiment of the processing system, indicated with 10', where an oscillator management circuit 11' is provided, which comprises an internal voltage regulator 12', which is coupled to the digital supply pin P3 and supplies as output a regulated power Vreg which is fed to the General Purpose Input/Output circuit 14. However an analog switch, indicated with 111 in this case, is placed in series on the output of the internal regulator 12', also integrated within the oscillator control circuit 11'. The oscillator control circuit 11' may be any oscillator control circuit adapted for the configuration of FIG. 2, e.g., a core already designed with an integrated regulator and switch, which embeds a crystal oscillator circuitry for RF communication. Such circuitry may be shared with the microcontroller embedding such oscillator control circuit.

Downstream the analog switch 111 the link is connected directly to the shared node P4. The analog switch 111 is then controlled by a first analog enable signal analog_en1 of the General Purpose Input/Output controller 15, in the same way of the analog enable signal analog_en of FIGS. 1 and 3. In other words in this embodiment, the analog switch 111 is located in the oscillator control circuit 11', not in the General Purpose Input/Output circuit 14. In some embodiments, one or more of the regulator 12' and the analog switch 111 may be separate from the oscillator control circuit 11'.

As shown in FIG. 2, the analog circuit 14a includes a switch 141', which can be controlled by an enable analog enable signal analog_en2 to enable coupling of an analog circuit 40a (not shown for simplicity) to the common node P4. When the first analog enable signal analog_en1 controls switch 111 to be on, enabling the power coupling to the oscillator 50, the enable analog enable signal analog_en2 is controls the switch 141' to be off, like the digital circuit 14b controlling signals. When the first analog enable signal analog_en1 controls switch 111 to be off, possibly gated by the external oscillator power enable signal ext_Xosc_pwr_en, which puts the switch 111 in an off state, the states of the switch 141' and other analog switches of the circuits of the digital circuit 14b, which may be present, is driven by the controller 15 according to the application requirements and commands of the CPU 30.

The disclosure provides the advantage that a regulated power from the processing circuit, e.g., microcontroller or SoC, internal voltage regulator to off-chip crystal oscillator without the addition of a dedicated node to the purpose. This keeping flexibility of GPIO's exploitation in order to cover different applications in general purpose market.

This is obtained by a combination of software and hardware controls which allows to share the same node between power connection from internal regulator and digital/analog connections from other microcontroller embedded IP's; this control logic enables the required functionality, according to software/hardware configuration, by controlling appropriately a general purpose Input/Output (GPIO), ensuring no contention/short happens on a shared node. More specifically, the power coupling or connection is routed through analog input made available by the microcontroller GPIO's.

The disclosure thus provides a software control bit (analog_en or analog_en1) to enable/disable power connection for the external crystal oscillator.

The disclosure also provides that such crystal oscillator Xosc power enable, e.g., the software control bit, is gated by digital control logic, e.g., logic 132, according to the required node configuration, e.g., Analog Mode for Power Connection and Digital Mode.

Thus, one or more embodiments may thus provide a processing system, in particular a microcontroller for general purpose application or a SoC, comprising:
- an oscillator controller circuit, e.g., supplying an oscillator signal, e.g., $Xosc\_c1$ to a clock controller 13 comprised in said processing system, generating a system clock, such oscillator controller circuit comprising at least a node for the coupling of an external crystal oscillator;
- an internal voltage regulator (regulator 12 or regulator 12' within oscillator controller 11) coupled to a digital voltage supply node supplying as output a regulated power;
- a General Purpose Input/Output circuit (GPIO) coupled to a common input/output node, comprising:
  - an analog circuit, comprising at least one switch configured to couple at least an analog link of the processing system to said common input/output node under the control of a General Purpose Input/Output controller; and
  - a digital input output circuit comprising input digital circuitry and output digital circuitry coupled to common input/output node and shared by a plurality of digital circuits of the processing system under the control of said General Purpose Input/Output controller, wherein said system includes a power coupling analog switch configured to selectively coupling under a control signal issued by the General Purpose Input/Output controller the regulated power to said common input/output node.

In one or more embodiments the General Purpose Input/Output controller is configured to control said switch on the basis of an external oscillator power enable signal issued by a control logic of the clock controller.

In one or more embodiments an external crystal oscillator is coupled through its signal output to said at least a node for the coupling of an external crystal oscillator and through its supply input to said common input/output node, and the control logic is configured to issue an external oscillator power enable signal enabling said General Purpose Input/Output controller to issue a control signal to close said analog switch and to issue disabling signals to said input digital circuitry and output digital circuitry of said digital input output circuit.

In one or more embodiments an external crystal oscillator is coupled through its signal output to said at least a node for the coupling of an external crystal oscillator and through its supply input to an external voltage source, and the control logic is configured to issue an external oscillator power enable signal enabling said General Purpose Input/Output controller to issue a control signal to close said analog switch and to issue respective enabling signals for input or output to said input digital circuitry and output digital circuitry of said digital input output circuit.

In one or more embodiments said analog switch (e.g., 141) is comprised in the General Purpose Input/Output circuit (in circuit 14, where it can be also one of many switches operating on different analog links).

In one or more embodiments said analog switch (e.g., switch 111) is comprised in the oscillator controller circuit and the General Purpose Input/Output is configured to issue at least a control signal to at least a switch (e.g., 141') operating on at least an analog link to an analog circuit (40a).

In one or more embodiments an apparatus (e.g., a microcontroller-based appliance) may include—a processor system interfacing with an Input/Output node by means of a system according to one or more embodiments.

A method of operation of a system according to one or more embodiments may include the method including selectively coupling under a control signal issued by the General Purpose Input/Output controller the regulated power to said common input/output node.

In one or more embodiments, such method includes issuing an external oscillator power enable signal to gate said control signal issued by the General Purpose Input/Output controller.

In one or more embodiments, issuing an external oscillator power enable signal to gate said control signal issued by the General Purpose Input/Output controller includes:
- in analog mode, to share a power coupling on the common node, issuing an external oscillator power enable signal enabling the propagation of the enable signal to the corresponding switch; and
- in digital mode, to allow coupling of digital circuits to the common node, issuing an external oscillator power enable signal disabling propagation of the enable signal to the corresponding switch.

It will be appreciated that the embodiments are not limited to application in the context of, e.g., for multi-purpose microprocessor-based consumer applications, in particular RF applications, such as home appliances and the like.

In some embodiments, the CPU 30 may include one or more processor circuit or processor cores and one or more memories. In some embodiments, the processor cores and the memories may be employed, alone or in various combinations with the illustrated circuitry, to provide the functionality of the processing system 10.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, convolutional accelerators, and including microcontrollers and/or embedded controllers), field-programmable gate arrays (FPGAs), complex programmable logic devices (CPLDs), etc., as well as devices that employ RFID technology, and various combinations thereof.

For instance, one or more embodiments may be applied to situations occurring in other consumer or industrial applications.

Without prejudice to the underlying principles, the details and embodiments may vary, even significantly, with respect to what has been described, by way of example only, without departing from the extent of protection.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
a clock control circuit, which, in operation, generates a system clock, the clock control circuit being coupled to a reference clock signal node that is configured to receive an external clock signal;
a plurality of circuits including:
a voltage regulator, which, in operation, supplies a regulated voltage;
a digital circuit; and
an analog circuit; and
input/output interface circuitry coupled to the plurality of circuits and a common input/output node, wherein the input/output interface circuitry, in operation, selectively couples one of the plurality of circuits to the common input/output node.

2. The integrated circuit according to claim 1, wherein:
the input/output interface circuitry includes an input/output control circuit; and
the input/output control circuit is configured to selectively couple one of the digital circuit or the analog circuit of the input/output interface circuitry to the common input/output node based on an oscillator power enable signal issued by the clock control circuit.

3. The integrated circuit according to claim 2, wherein:
the common input/output node is configured to couple to a supply input node of an external crystal oscillator; and
the clock control circuit is configured to issue the oscillator power enable signal enabling the input/output control circuit to issue a first control signal to enable an analog switch coupled between the analog circuit and the common input/output node and to issue a second control signal to disable a digital input/output circuit coupled between the digital circuit and the common input/output node.

4. The integrated circuit according to claim 2, wherein:
an external voltage source is coupled to a supply input node of a crystal oscillator; and
the clock control circuit is configured to issue the oscillator power enable signal enabling the input/output control circuit to issue a third control signal to disable an analog switch coupled between the analog circuit and the common input/output node and to issue a fourth control signal to enable a digital input/output circuit coupled between the digital circuit and the common input/output node.

5. The integrated circuit according to claim 1, wherein the digital circuit includes an input digital circuit and an output digital circuit.

6. The integrated circuit according to claim 1, comprising a power coupling analog switch configured to couple the regulated voltage to the common input/output node under a control signal issued by the input/output interface circuitry.

7. The integrated circuit according to claim 1, wherein the power coupling analog switch is external to the input/output interface circuitry.

8. The integrated circuit according to claim 7, comprising an oscillator control circuit that, in operation, supplies an oscillator signal to the clock control circuit; and
wherein the power coupling analog switch is included in the oscillator control circuit.

9. The integrated circuit according to claim 6, wherein the input/output interface circuitry is configured to issue a first control signal to control the power coupling analog switch and a second control signal to control the analog circuit.

10. A system, comprising:
a processor system including:
a clock control circuit, which, in operation, generates a system clock, the clock control circuit being coupled to a reference clock signal node;
a plurality of circuits including:
a voltage regulator, which, in operation, supplies a regulated voltage;
a digital circuit; and
an analog circuit; and
input/output interface circuitry coupled to the plurality of circuits and a common input/output node, wherein the input/output interface circuitry, in operation, selectively couples one of the plurality of circuits to the common input/output node; and
a crystal oscillator coupled to the reference clock signal node.

11. The system of claim 10, wherein the input/output interface circuitry includes:
at least one switch coupled between the common input/output node and the analog circuitry;
digital input circuitry to receive a digital input from the common input/output node; and
digital output circuitry to send a digital output to the common input/output node.

12. The system of claim 11, wherein:
the input/output interface circuitry includes an input/output controller;
the digital input circuitry is connected to send the digital input to the input/output controller; and
the digital output circuitry is connected to receive the digital output from the input/output controller.

13. The system of claim 12, wherein in operation, the input/output controller sends one or more of:
a first control signal to control a first state of the at least one switch;
a second control signal to control a second state of the digital input circuitry; or
a third control signal to control a third state of the digital output circuitry.

14. The system of claim 11, wherein the input/output interface circuitry includes a common rail connected between the common input/output node and each of the at least one switch, the digital input circuitry and the digital output circuitry.

15. The system of claim 11, wherein the voltage regulator is connected to the common input/output node through a first switch of the at least one switch.

16. The system of claim 15, wherein the processor system includes an oscillator control circuit that includes the voltage regulator and the first switch.

17. The system of claim 11, wherein the voltage regulator is connected to the common input/output node through a first switch external to the input/output interface circuitry.

18. The system of claim 17, wherein the input/output interface circuitry includes a common rail, and the first switch is connected to the common rail, the common rail being positioned between the common input/output node and each of the at least one switch, the digital input circuitry and the digital output circuitry.

19. A method, comprising:
generating, by a clock control circuit of an integrated circuit, a system clock;
selectively coupling one of a plurality of circuits of the integrated circuit to a common input/output node, the plurality of circuits including:
a voltage regulator, which, in operation, supplies a regulated voltage;
a digital circuit; and
an analog circuit; and
wherein when the common input/output node is coupled to an input node of an external crystal oscillator, the voltage regulator is coupled to the common input/output node.

20. The method according to claim 19, further comprising issuing, by the clock control circuit, an external oscillator power enable signal that controls coupling the voltage regulator to the common input/output node.

* * * * *